United States Patent [19]

Weresch

[11] 4,206,539

[45] Jun. 10, 1980

[54] DEVICE FOR BENDING, CRIMPING, AND TRIMMING LEADS OF TRANSISTORS OR SIMILAR COMPONENTS

[76] Inventor: Thomas Weresch, Greschbachstr. 19, D-7500 Karlsruhe 41, Fed. Rep. of Germany

[21] Appl. No.: 888,146

[22] Filed: Mar. 20, 1978

[30] Foreign Application Priority Data

May 17, 1977 [DE] Fed. Rep. of Germany ....... 2722212

[51] Int. Cl.² ...................... B21F 45/00; B65G 47/24
[52] U.S. Cl. .................................. 29/566.3; 29/33 M; 140/105; 198/391
[58] Field of Search .................. 29/33 M, 33 F, 35.5, 29/564.8, 566.3, 739, 741, 566.4, 750, 751, 752; 269/275; 140/1, 105, 106; 72/DIG. 10, 409, 410; 83/411 A; 198/391; 81/421

[56] References Cited

U.S. PATENT DOCUMENTS

| | | | |
|---|---|---|---|
| 3,114,448 | 12/1963 | Boris | 198/391 |
| 3,147,779 | 9/1964 | Brown | 140/105 X |
| 3,288,267 | 11/1966 | Taylor et al. | 198/391 X |
| 3,487,524 | 1/1970 | Filia | 29/750 |
| 3,655,028 | 4/1972 | Hodgins | 198/391 |
| 3,918,472 | 11/1975 | Brown | 140/106 |
| 4,003,413 | 1/1977 | Hanson et al. | 140/1 |
| 4,108,217 | 8/1978 | Westberg | 140/105 |

*Primary Examiner*—Z. R. Bilinsky

*Attorney, Agent, or Firm*—Craig & Antonelli

[57] ABSTRACT

A device is provided for automatically and continuously bending, crimping, and trimming the leads of electrical components having leads located on only one side of the component body. A vibrating supply container is provided which stores components and supplies the components to a conveyor. The conveyor transfers the components in sequence, one at a time adjacent one another in a groove to a transfer slot. A rotatable turning disc is provided adjacent the transfer slot which carries crimping and bending tools at the periphery thereof. The tools are arranged in pairs, with one of the tools being pivotally mouned at the carrier disc and the other being relatively fixedly mounted. The relatively fixedly mounted tool is disposed so as to grip a component in the transfer slot as the carrier is rotated thereby, while the pivotally mounted tool subsequently is pivoted into crimping engagement with the leads as the carrier continuously rotates. In preferred embodiments, a cutter wheel is arranged adjacent the rotating carrier to automatically trim the leads after the crimping operation. An ejection device is provided for removing the components from the tools as the carrier rotates past a fixed stop triggering the ejection device. A fixed cam member is provided for engaging with a cam follower at the pivotal tool to sequentially open and close the tools during the rotation of the carrier.

43 Claims, 13 Drawing Figures

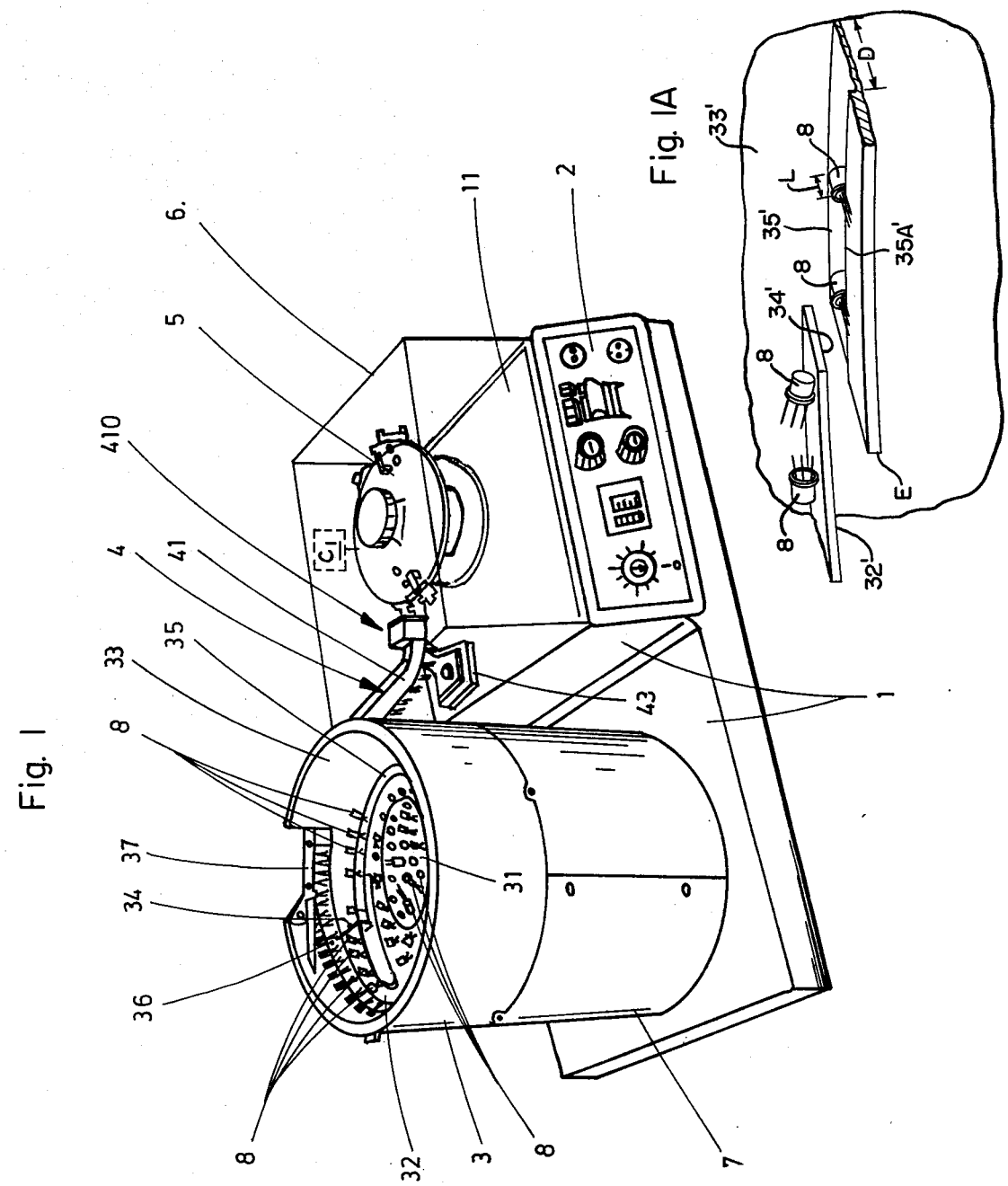

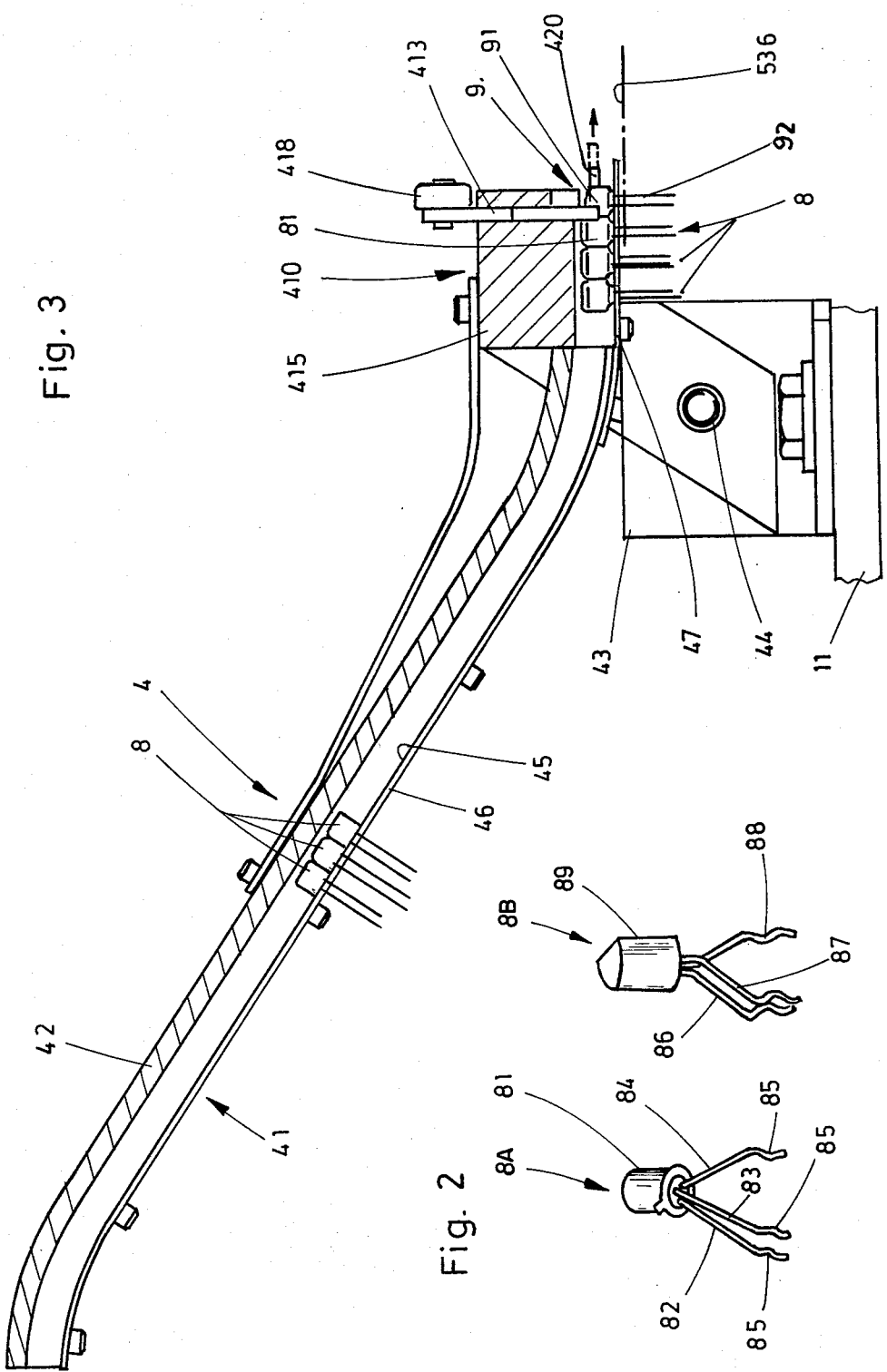

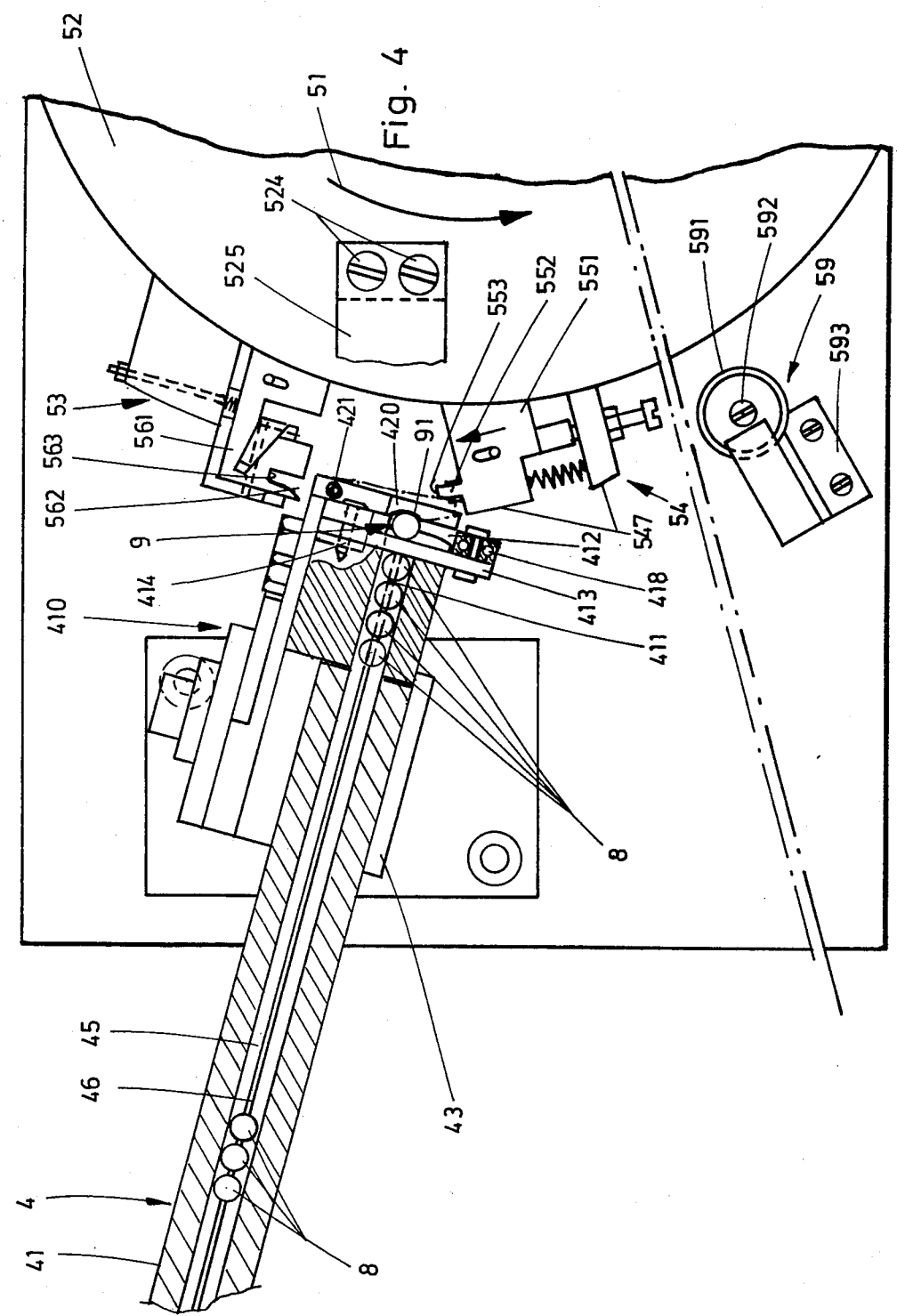

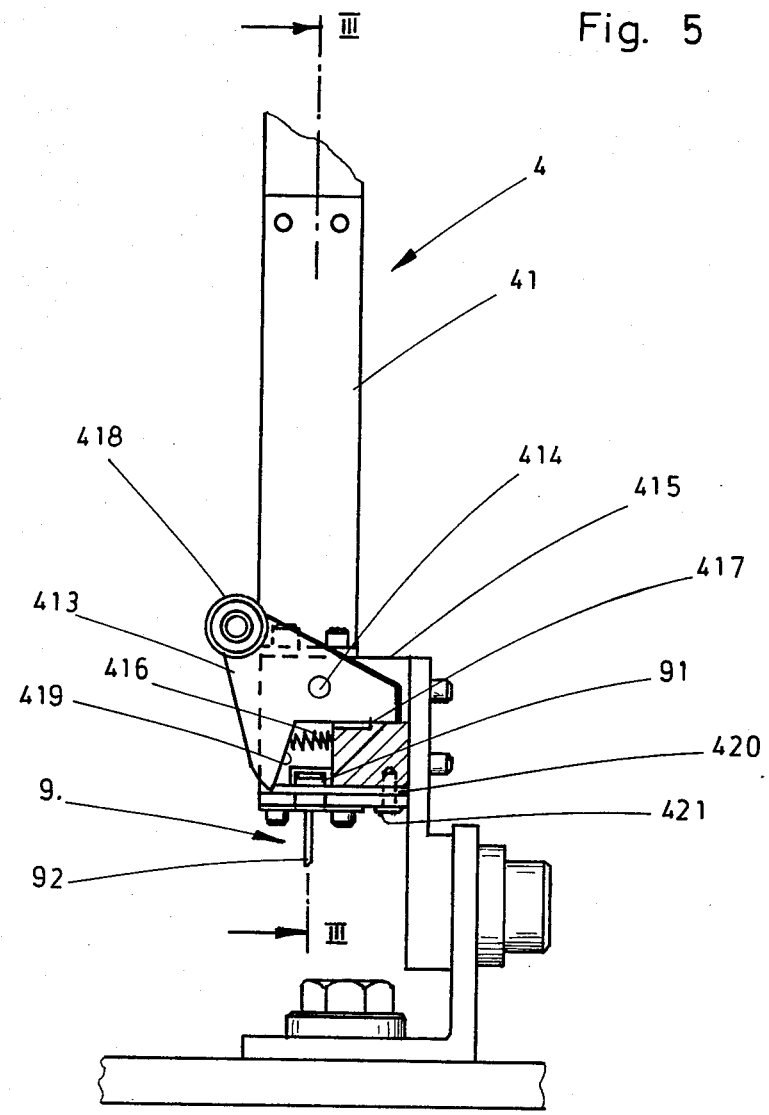

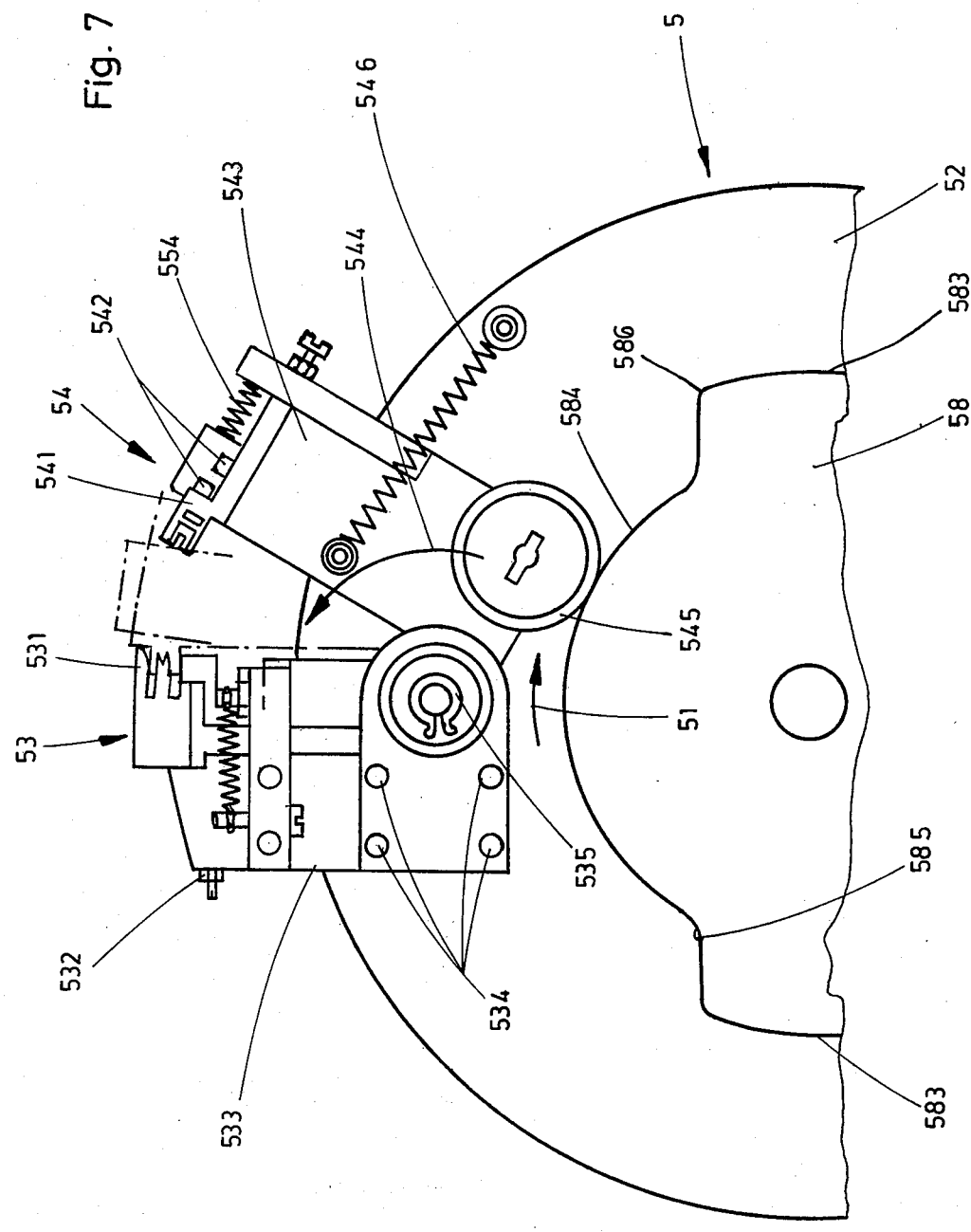

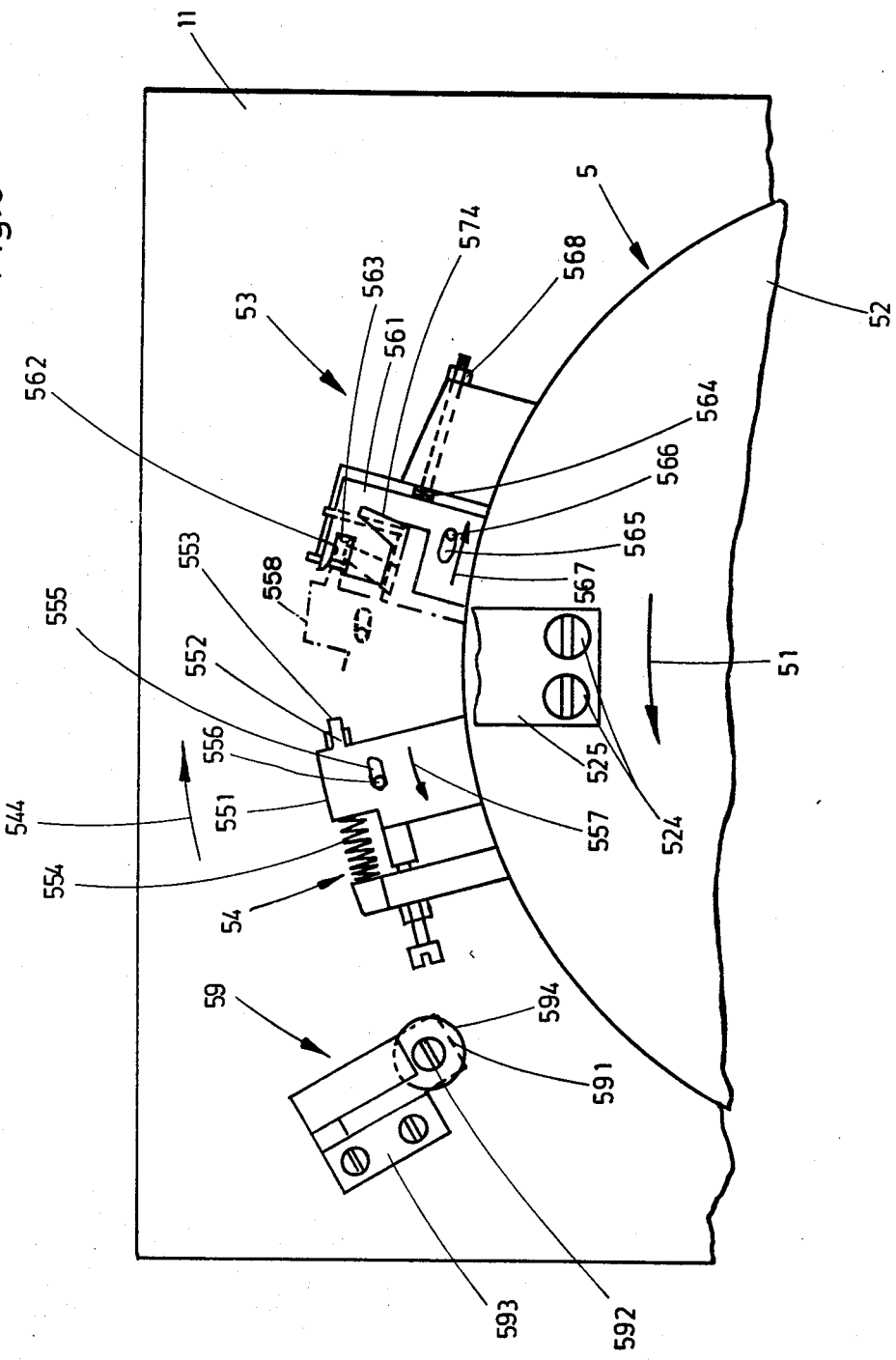

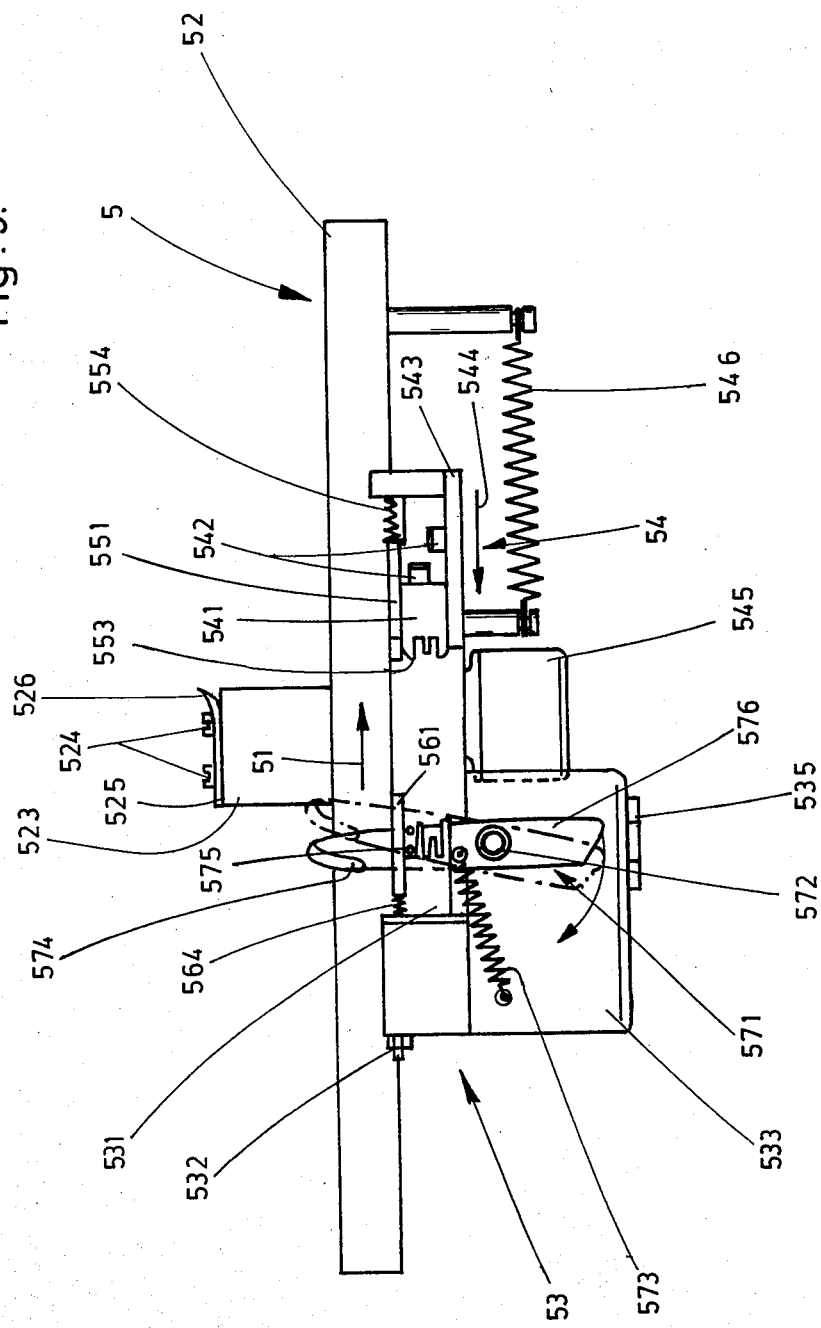

DEVICE FOR BENDING, CRIMPING, AND TRIMMING LEADS OF TRANSISTORS OR SIMILAR COMPONENTS

BACKGROUND AND SUMMARY OF THE INVENTION

The invention relates to a device for bending, crimping, and trimming the leads of electrical components, particularly components whose leads are located on only one side of the component body, e.g. transistors. The device includes a supply container to store the components, two tools for bending and crimping, said tools working against one another and deforming the leads between them, followed by a cutting tool to trim the leads.

The invention is designed for use primarily only with those components in which the leads emerge on one side only, as is the case for transistors for example. The problem arises in this connection that these components, because of their unsymmetrical design, are difficult to transport continuously and to feed to a processing machine, and on the other hand the leads must be bent and crimped in different directions, so that the guide means as well as the tools must be made rather complicated. Devices known heretofore, therefore, do not operate completely automatically, but the components must be fed to the tools by hand. Thus, for example, it is known to feed the bodies of the components into recesses in a revolving plate, so that the leads extend upward. This revolving plate then moves past stationary processing tools and is stopped at each work station.

The efficiency of a machine of this type is naturally dependent on the one hand upon the working speed of the operator who places the components in the revolving plate and on the constant delays which result from braking the revolving plate at the work station and then accelerating it again.

An object of the invention is to provide a completely automatically operating device, which allows a considerable increase in production efficiency.

This object is achieved according to preferred embodiments of the invention which include the following provisions:

(a) the tools for bending and crimping are disposed pairwise along the periphery of a carrier rotating about an axis, with one of the tools being mounted relatively firmly and the other mounted swivelably in the rotational plane of the carrier or a plane parallel thereto;

(b) the swivelable tool is controlled by a cam, which cam moves the swivelable tool during the rotation of the carrier from the open position of the tools into the closed position, or working position;

(c) a conveyor which feeds the components one after the other to the tools is disposed between the supply container and the rotating carrier;

(d) the conveyor is provided at the transfer point to the tools with a transfer slot disposed approximately at the level of the tools, extending in the direction of rotation of the latter, and open in this direction, in which a component is stored and through which its leads extend vertically downward, whereby (e) the swivelable tool is controlled by the cam in such manner that the component stored in the transfer slot when the tool is in the open position is gripped by the tool moving in the rotational direction, after which the tools are closed.

In contrast to many known prior art arrangements, the components in this invention are not placed in a rotating carrier and conveyed to stationary tools, but rather the components are placed in a stationary position in the transfer slot and automatically removed therefrom by the tool located further along the rotational direction. During rotation, the necessary movement for gripping and deforming the component between the tools is provided to the swivelably mounted tool during rotation by means of the cam. This means that it is no longer necessary to stop the carrier intermittently during processing, and to accelerate it again; instead, processing takes place during continuous rotation. Likewise, in the transfer area, there are no delays which reduce production efficiency because manual feed is eliminated. The production efficiency depends only upon the capacity of the conveyor. Such conveyor can theoretically be of a conventional design according to certain contemplated embodiments.

In a preferred embodiment, the carrier is a disc, so that several sets of tools can be disposed around its periphery if necessary.

The swivelable tool is preferably actuated by a spring which forces it into the open position, said spring being supported for example against the carrier disc.

The cam which serves to control the swivelable tool preferably consists of a circular section with a large diameter and a circular section of a small diameter, with abrupt transitions, whereby the small-diameter section is located approximately opposite the transfer point with the transfer slot. On the circular section with the large diameter, the tools are closed. In this position, the leads are deformed and trimmed. At the beginning of the abrupt transition to the small-diameter section (after the tools have performed bending and crimping), the movable tool is swiveled under the influence of the spring abutting it, so that the component is freed and can be ejected, for example by a stationary ejector. The tool reaches the maximum open position in the area of the curved section with the small diameter. At this time, the tools pass the transfer slot, so that one of the tools grips the component as it passes. As the carrier continues turning, the tool cam follower slides and/or rolls back up the steep transition to the large diameter, so that the tools close. An abrupt transition is recommended because this allows a particularly compact design. Moreover, this causes the opening and closing movement to be very rapid, so that the component does not drop out prematurely, for example as the tools close. For this reason, it is also preferred to make the slope of the curve which is responsible for closing the tool steeper than the one for opening the tool.

In many known machines, the leads are simply gripped between the tools and deformed. Since this results in forces being developed not only transversely to the leads but also in the direction of the leads, there is the danger that the leads will be torn out of the body of the component. Therefore, at least in rapidly operating machines, such as the device according to the invention, it is recommended to apply a tensile stress to the leads opposite the component body.

In order to produce such a tensile stress, according to the invention provision is made for having a holder or a brace located above each of the two tools for bending and crimping, which holders grip the leads of the components directly beneath the body of the component. In preferred embodiments said holders or braces are mounted with limited movement relative to the tool with which they are associated under the action of a spring and are provided with a stop, in such manner that during the closing movement of the swivelable tool the holder associated therewith is carried along until it comes to rest against the brace (at the other tool); and then, at the beginning of the actual working movement, the brace is also brought up against the spring supporting it, and finally, when the holder and brace come to a halt, the swivelable tool is moved into the closed position against the spring which supports the holder.

In this design, therefore, the leads are first gripped between the holder and the brace during the closing movement of the tool, and thereby relieve the body of the component from tension. Then, with the holder and brace participating in the movement, the leads are deformed in one direction, and then, with the holder and brace at rest, deformation is carried out in the opposite direction, since the swivelable tool can continue moving forward for the distance which is required for deformation while the holder and brace are stopped.

These and other objects, features and advantages of the present invention will become more apparent from the following description when taken in connection with the accompanying drawings, which show, for purposes of illustration only, a single embodiment in accordance with the present invention.

BRIEF DESCRIPTION OF THE DRAWINGS

FIG. 1 is an isometric overall view of a component lead preparing device constructed in accordance with a preferred embodiment of the present invention;

FIG. 1A is an enlarged schematic view showing details of a preferred embodiment of ramp structure in the vibrating pot for sorting and orienting the components;

FIG. 2 is an isometric view of two components with prepared leads;

FIG. 3 is a side schematic view of the conveyor;

FIG. 4 is a lengthwise sectional schematic view through the conveyor, with a partially cutaway view of the tool carrier of the device;

FIG. 5 is an end view of the groove and transfer point of the tool carrier of the device;

FIG. 7 is a detailed view of the carrier disc and tools of the device from below;

FIG. 8 is a detailed view of the tools and the carrier disc of the device from above;

FIG. 9 is a detailed view of the tools and the carrier disc of the device from the side.

DETAILED DESCRIPTION OF THE DRAWINGS

Figure 6:
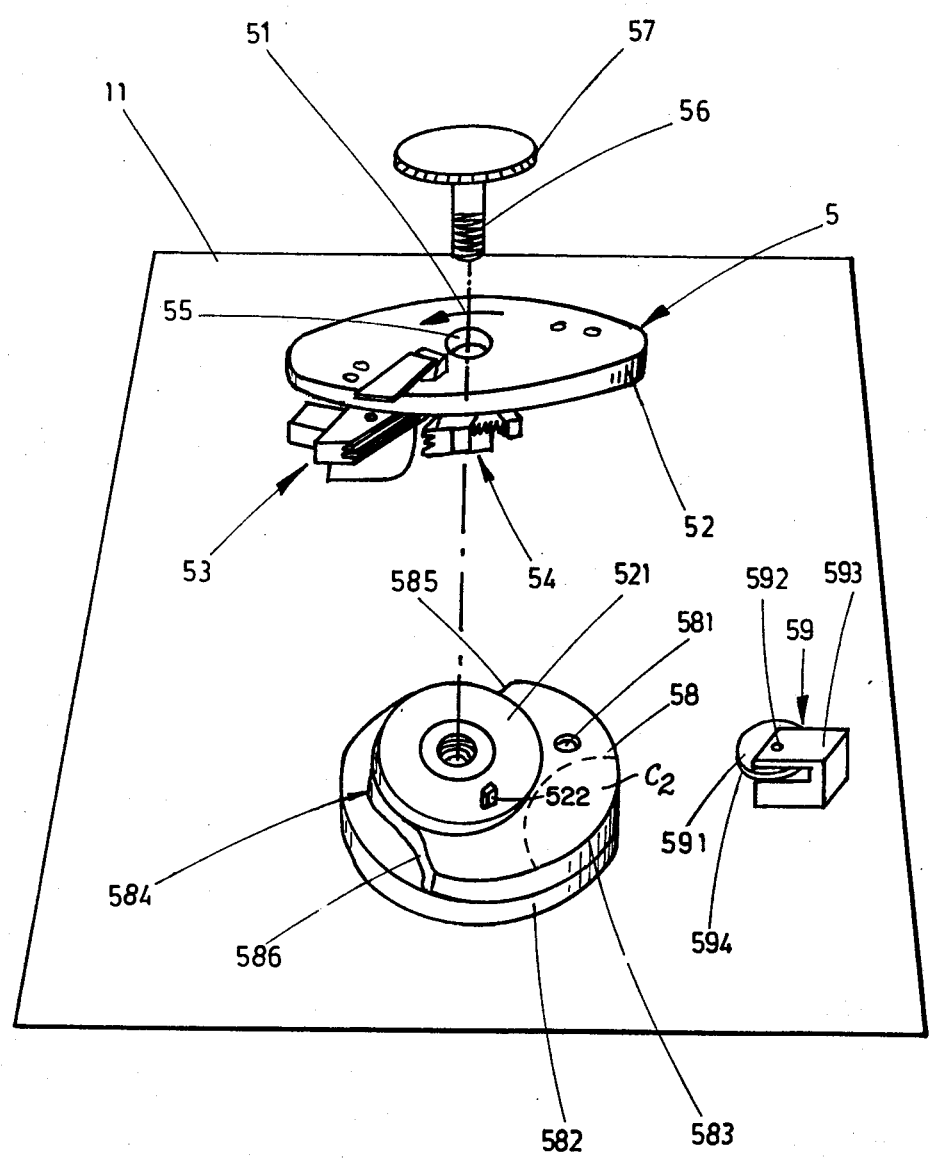
FIG. 6 is an exploded view of the tool carrier and cam of the device.

The device shown in FIG. 1 includes a housing 1, with a control panel 2, a supply container 3, a conveyor 4 connected thereto, and a tool carrier 5, preferably covered by a transparent hood 6, through which hood the conveyor is introduced. An electric motor and a drive connection for driving tool carrier 5 are provided in housing 1. Supply container 3 is made in the form of a vibrating or shaking pot, and is mounted for this purpose on a vibrator located in cylindrical housing 7.

The device serves to process those electrical components whose leads are mounted on only one side, e.g. transistors. Two components 8A and 8B of this kind are shown in FIG. 2. The component 8A shown at the left has a cylindrical body 81 and three leads 82, 83, 84, which in the initial state are originally parallel, and in this embodiment, must be bent in two different directions (82 and 83 in one direction and 84 in another) and provided with crimps 85. The other component 8B in FIG. 2 differs from the first one in that body 89 is made in the form of a partial cylinder and leads 86, 87, 88 are bent at a certain distance from the lower end of the body. In addition, in both cases the ends of leads 82, 83, 84 and 86, 87, 88 are bent once more beneath crimps 85, in order to allow the "legs" to fit with some tension into holes provided in a conventional circuit board.

In the original unprepared state, components 8 are loaded loosely and mixed, with parallel leads, in vibrating pot 3. Vibrating pot 3 has a ramp 32 which rises from bottom 31, on which ramp 32 the components slowly travel upward and are sorted out individually, with the components preferably traveling upward along wall 33 as a function of the nature of the vibration and their mass distribution, until they reach an edge 34. Here they fall onto a second rising ramp 35, but the latter is mounted at a distance from wall 33. This causes the components 8 to arrange themselves in such manner that the bodies of components 8 hang freely in the space between ramp 34 and wall 33 without support, while the leads rest on ramp 35. Ramp 35 is inclined toward the center of the container for this purpose. The slope angle increases up to a section 36 on ramp 35; the components are moving at an increasing slope with their leads downward. Then components 8 enter conveyor 4, with the aid of a deflector 37, which guides the components by means of their bodies and arranges them in a nearby vertical position with their leads pointing downward.

FIG. 1A is an enlarged schematic view showing a preferred arrangement for automatically sorting and orienting the components in the vibrating pot 3 so that they are correctly aligned as they are supplied to conveyor 4. The vibrating pot functions as follows: appropriate vibrations, for example combined axial and torsional vibrations, lift the components and move them upward along a helical ramp. The optimum adjustment of the vibrations is a function of frequency, amplitude, and in the case of combined vibrations, phase; it depends especially upon the steepness of the ramp and the weight of the components. Since vibrating pots as such, and mechanisms for imparting vibrations thereto, are generally known, the details thereof are dispensed with herein in order to avoid obscuring the present invention. The novel arrangement depicted in FIG. 1A consists in the special design of the vibrating pot making it possible for the wire leads of the components 8 to be automatically aligned radially inward. The ramp structure is provided with a feed section ramp 32' and an alignment section ramp 35', wherein the lower end of the alignment section ramp 35' begins below the upper end of the feed section ramp 32', and wherein the alignment section ramp 35' is provided with a holding edge 35A', facing toward the wall 33' of the pot, and disposed at a distance from the wall 33', with said alignment section ramp 35' being sloped radially downward toward the center of the pot. Preferably alignment section ramp 35' is sloped so as to be steeper as it moves upwardly toward the entrance to conveyor 4, whereby the components are effectively moved to a more vertical position (leads pointing downwardly) as they travel upward on the alignment section ramp 35'. The holding edge 35A' is disposed a distance D from wall 33', which distance D is greater in length than the length L of the bodies of the individual components 8. This arrangement of FIG. 1A makes it possible for the components 8 at the upper end of the feed section ramp 32' to fall over the terminal edge 34' of the latter downward onto the section ramp 35', and to remain hanging there by their bodies on the holding edge 35A', while the wire leads orient themselves radially under the influence of gravity. Components which cannot be held by the holding edge 35A' in this manner fall over the alignment section edge E and down into the bottom of the pot 3, to be conveyed upward once more. See FIG. 1 for an illustration of the relative position of the ramps, it being noted that the portion 34' of FIG. 1A is in the same relative position in pot 3 as the feature 34 illustrated in FIG. 1.

Conveyor 4 is provided with a groove portion 41 (FIG. 3), which is preferably closed by a cover 42 to form a channel. Groove portion 41 is supported by a bracket 43 on housing 1 (FIG. 1), whereby it is made height-adjustable for example by means of an adjustment screw 44. The groove portion 41 is sloped and has a longitudinal slot 46 in its bottom 45 (FIG. 4). The leads of components 8 hang down through the slot 46 (FIG. 3), while the component body slides along the groove bottom 45. Because of the slope of groove portion 41 and the constant pushing from new components coming from vibrating pot 3, the components 8 in the groove are pressed against one another. Groove portion 41 makes a transition at its lower end to a horizontal section 47 with a short length, and is provided therewith a transfer device 410, by which the components are fed individually to tool carrier 5.

Transfer device 410 is provided with a slot 411 (FIG. 4) which is a continuation of slot 46 in the bottom 45 of groove 41, said slot 411 terminating at its end in a transfer slot 412 running approximately at right angles thereto. Slot 412 runs approximately in the direction of rotation of tool carrier 5 and/or 52 as indicated by arrow 51 (parallel to a tangent to the circumferential path of tool carrier 5). Slot 412 is also open in the circumferential direction (direction of movement of carrier 5). The foremost component 9 in the feed direction emerges from slot 46 and moves into transfer slot 412 where it can be removed from the open side of slot 412 (side of slot 412 shown facing downwardly in FIG. 4).

In order to separate this component 9 from the next preceding component 8 at the moment that component 9 is to be removed, and to prevent the other components from sliding out, a separating slide 413 is provided, which slide 413 is swivelably mounted to a block 415 of the transfer device 410 by means of a pin 414. The separating slide 413 is subject to the action of a pressure spring 416 which holds it in the open position (FIG. 5), said spring 416 pushing the separating slide 413 against a stop 417. The separating slide is swivelably moved against the spring by engagement of a deflector against the guide roller 418 mounted thereon (details below), whereby its edge 419 pushes between head 91 of component 9 and head 81 of component 8. Leads 92 of component 9 fit through transfer slot 412 and project downward.

The forward wall of transfer slot 412 is formed by a horizontal holder 420, which is swivelably mounted on a pin 421 mounted in block 415 and is subject to the action of a spring, not shown, which tends to force it into a position shown in FIG. 4, in which the transfer slot has its narrowest cross section. The swiveling holder 420 has its surface which faces transfer slot 412 against body 91 of component 9, so that the latter is gripped with a slight force under the influence of the spring not shown between swiveling holder 420 and separating slide 413 and centered, and can only be removed against this force at the open end of the transfer slot, whereby swiveling holder 420 is swung out into the position shown by the dashed lines in FIGS. 3 and 4.

Transfer device 410 transfers the components to tool carrier 5 (FIG. 1), whose individual parts are shown in greater detail in FIGS. 6 to 9. Let us first look at the schematic exploded view in FIG. 6. Tool carrier 5, in the embodiment shown, is made in the form of a circular carrier disc 52. In other preferred non-illustrated embodiments the tool carrier is made in the form of a live ring, a simple supporting strip, or the like. On carrier disc 52, two bending and crimping tools 53, 54 cooperating with one another are mounted pairwise, of which only one pair is shown in FIG. 6. One tool is fastened directly to carrier disc 52, while the other is swivelably mounted to carrier disc 52 and is movable from the open position shown into the closed position in which it cooperates with fixed tool 53. This will be described in more detail below.

Carrier disc 52 has a through hole 55 for a screw 56 with a knurled head 57, by means of which the carrier disc can be screwed onto flange 521 of a drive shaft, not shown, disposed in housing 1. A pin 522 serves to arrest it. In this manner, the carrier with the entire set of tools can be readily exchanged. The drive shaft is surrounded beneath flange 521 by a cam 58, which is mounted by means of a pin 581 to a disc 582 mounted on cover plate 11 of housing 1 in a permanent and fixed manner. Furthermore, a cutting tool 59 is provided on cover plate 11 of housing 1 to trim the leads of the components. This cutting tool is mounted in such fashion that it intersects the path described by the leads as carrier disc 52 rotates, at a point where bending and crimping are complete. The cutting tool, in the embodiment shown, consists of a cutting wheel 591, rotatably mounted by shaft 592 in a holder 593, said holder being fastened in turn to cover plate 11. Cutting edge 594 of cutting wheel 591 is preferably arranged so that it passes directly beneath the underside of bending and crimping tools 53, 54 (tools 53, 54 pass directly over cutting edge 594) thus trimming the leads.

Bending and crimping tools 53, 54 are shown in greater detail in FIG. 7, which is a view from below of carrier disc 52. Both tools 53, 54 are provided with the actual shaping tools 531, 541, which are mounted adjustably by means of screws 532, 542 on support arms 533, 543, and are preferably interchangeable. The working surfaces and edges of the shaping tools are only indicated as an example in FIG. 7, since their arrangement, number, and exact shape are a function of the desired form of the leads. Support arm 533 of tool 53 is mounted by means of screws 534 to support disc 52, while support arm 543 is swivelably mounted, and in the embodiment shown, by means of shaft 535 mounted in support arm 533. Support arm 543, together with tool 54, can therefore execute a pivotal movement in the direction of arrow 544 opposite the rotational direction 51 of support disc 52. To control this movement, support arm 543 is provided with a guide roller 545, which is constantly pressed against cam 58 (FIG. 6), under the influence of a tension spring 546 which engages support arm 543 and abuts carrier disc 52.

Cam 58 is provided for controlling pivotal movement of tool 54 with a section 583 with a large diameter and a section 584 with a small diameter, which merge into one another by steep, nearly vertical sections 585, 586 (FIG. 6). While guide roller 545 is in contact with section 584 of small diameter, tools 53, 54 are in the open position shown in FIGS. 6 and 7, while when guide roller 545 is on the large-diameter section, they are in the closed position shown in FIG. 7 by the dot-dashed lines, the working position. On section 585, they move from the closed position into the open position while in section 586 the situation is reversed.

On the upper side of bending and crimping tools 53, 54, a holder 551 (tool 54 side) and a bracket 561 (tool 53 side) in the shape of a plate are mounted (FIG. 8). Holder 551 associated with swivelable tool 54 is provided with a nose 552, while holder 561 associated with fixed tool 53 is provided with a corresponding recess. The leading edge 553 of the holder and the opposite edge 563 of the bracket serve to relieve the tension on the leads while they are being shaped. The leads are gripped immediately beneath the body of the component during the shaping process. For this purpose, holders 551 and brackets 561 are swivelable to a limited extent relative to tools 53, 54, e.g., they are mounted by means of pivot shafts (not shown) on their support arms 533, 543. Holder 551 is subjected to tension by a compression spring 554, and the bracket by a pressure spring 564. Both are provided with a slot 555, 565, into each of which fits a stop 556, 566 which is mounted on the support arms of the tools. Holder 551 and bracket 561 can also move against tools 53, 54 and against pressure springs 554, 564 for the length of slots 555 or 565 according to the directions indicated by arrows 557, 567. One of the two springs, spring 564 in the example shown, is adjustable, e.g., by means of a screw 568. This is intended to ensure that when holder 551 and bracket 561 grip tension-relieving edges 553, 563, in all cases bracket 561 will be deflected. The reason for this will be described further below. First of all, however, we must look at FIG. 9.

After the leads have been shaped, it may happen that the latter remain hanging on fixed tool 53. In order to prevent this from happening and to eject the finished component always at the same place in the device, for example into an ejection chute not shown, an ejector 571 is provided which is swivelably mounted between shaping tools 531 and/or 541 and carrier disc 52 at support arms 533 at 572, and tensioned by a tension spring 573. This spring 573 holds the ejector in a vertical position, in which it does not impede the shaping process. Ejector 571 is provided with an upwardly extending arm, with an ejector nose 574 bent over above bracket 561, and an additional ejector nose 575, which fits between the shaping surfaces of the tools from the side. The upper ejection nose 574 acts against the body of the component, as the lower ejection nose works against the leads. Ejector 571 is also provided with a downwardly extending arm 576, which runs against a stop for ejection purposes, said stop being mounted for example on cover plate 11 of housing 1. The stop is arranged so that it becomes effective for the first time during rotation of carrier disc 52 when the shaping process is complete and the tools 53, 54 have reopened. The stop tips ejector 571 about its axis 572, so that it assumes the position shown by the dot-dashed line and thus releases the component from fixed tool 53. In other preferred, non-illustrated embodiments, a fixed ejector is provided, mounted on the cover plate 11 of the housing and provided for example with a circulating finger or the like, which seizes the passing component from behind and ejects it.

On carrier disc 52, in the vicinity of tools 53, 54, as shown in FIGS. 6, 8 and 9, a block 523 is provided, upon which a control element 525 in the shape of a spring tongue is fastened by means of screws 524. This spring tongue, which can be bent up slightly at its corner 526 which is forward in the direction of rotation, serves to control separating slide 413 (FIGS. 3 to 5) and cooperates for this purpose against its guide roller 418, in order to swivel it to the separating position when tools 53, 54 pass transfer slot 412. The spring-loaded design makes tongue 525 flex upward in the event of a malfunction.

The operation of the device is described below:

Components 8 are stored side by side in slot 46 of groove 41 and slot 411 of transfer device 410 (FIG. 4). The foremost component 9 is stored at the transition from slot 411 to transfer slot 412 and is guided sidewise there by swivelable holder 420. Support disc 52 rotates continuously in direction 51, whereby tools 53, 54 open and close once during each revolution. Due to the arrangement of cam 58 (FIGS. 6 and 7), the open position occurs when the completely finished components are ejected and is maintained until tools 53, 54 reach the area of transfer device 410 (FIG. 4). Tool 54, traveling in rotational direction 51, has its guide roller 545 resting against section 584 with the small diameter on cam 58 (FIG. 7), so that on the one hand the aperture angle of the tools is maximum while on the other hand the swivelable tool 54 is displaced slightly inward toward the center of carrier disc 52 relative to tool 53. As a result of this displacement, the outside edge 547 of this tool (FIG. 4) passes the leads of component 9 resting in transfer slot 412 without touching them. Moreover, transfer device 410 is adjustable on block 43 by means of screw 44 relative to carrier plate 52 heightwise, such that the upper parts of tools 53, 54 pass directly beneath the transfer slot 412. This is indicated in FIG. 3 by the dot-dashed line 536. Therefore, while the advancing tool 54 passes leads 92 of component 9 (FIGS. 3 and 4), tool 53 is mounted on carrier disc 52 in such manner that it engages this component at the leads 92, initially by means of recess 562 in bracket 561. Previously, spring tongue 525 by means of guide roller 418, has swung separating slide 413 in the manner described above into the separating position, so that component 9 is separated from the next component 8 and, when gripped by the next tool 53 with simultaneous movement of swiveling holder 420 (FIG. 4), is removed from transfer slot 412. At this point, spring tongue 525 again releases guide roller 418, so that the next adjacent component 8 can slide down into the position of component 9.

Figure 10A:
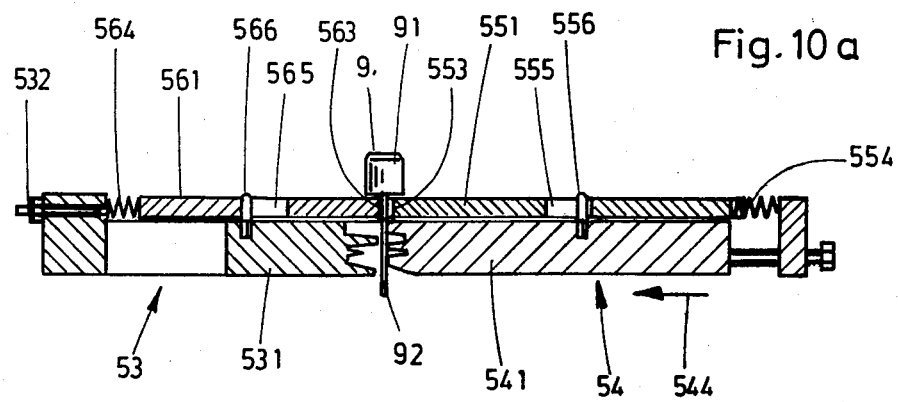
FIGS. 10a, b, c show a view of the tools in various stages of the work, similar to FIG. 9, but cut away.

As soon as component 9 has been gripped, guide roller 545 of advancing tool 54 reaches the steep transition 585 on the cam and is then accelerated against its direction of rotation 51 toward fixed tool 53 (arrow 544 in FIG. 8) and finally reaches position 558 shown by the dot-dashed line FIG. 8 for holder 551, in which recess 562 of bracket 561 is closed by the nose 552 of holder 551, and finally the leads 92 are gripped firmly between edges 553 and 563. This position is shown in greater detail in FIG. 10a.

Figure 10B:
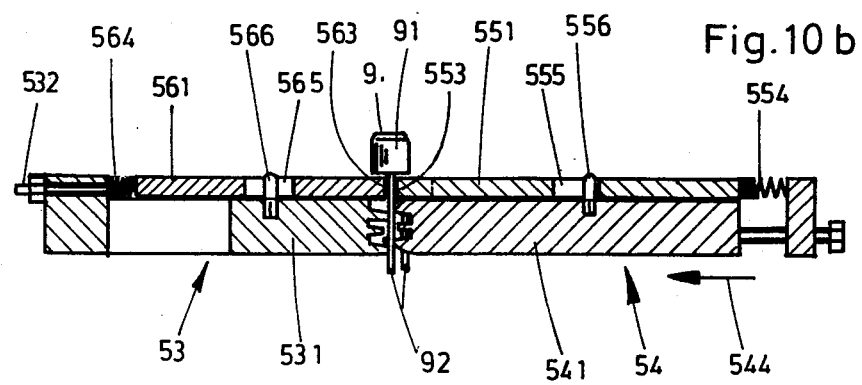
Figure 10C:
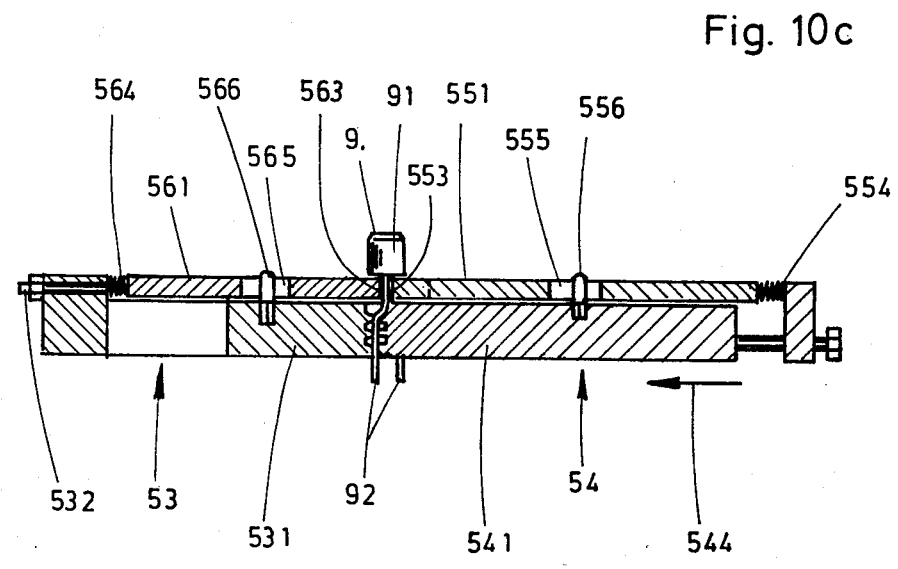

Guide roller 545 of tool 54 continues rolling along the steep transition 586 on cam 58, whereby bracket 561 of tool 53 is pushed leftward against the force of spring 564 in the drawing, in other words, bends back opposite the actual shaping tool 531 and reaches the position shown in FIG. 10b. Then shaping tool 541 engages shaping tool 531, and one or two leads 92 (depending on their arrangement) are bent in one direction. Then holder 551 bends back against shaping tool 541, since spring 564 is now compressed, and then spring 554 is relaxed. This causes the shaping tools 531 to grip harder, so that one or the other lead is shaped, as indicated in FIG. 10c. At the same time or a little thereafter, the crimps are formed in the leads. During the entire shaping process, leads 92 are relieved of tension relative to the body of the component, since holder 551 and bracket 561 remain in the clamping position and the shaping movement takes place without special control required therefor.

In the closed position of tools 53, 54, which is achieved when guide roller 545 of tool 54 moves along section 583 of the cam, the components are guided past the fixed cutting tool 59, whose cutting wheel 591 trims off the leads to the desired extent. Then guide roller 545 moves inward again along the steep transition 585 of cam 58, so that tools 53, 54 open. In this open position, ejector 571 (FIG. 9) strikes the fixed stop described above, not shown, with its downwardly extending arm 576, is swiveled thereby, and ejects the component. The open tools 53, 54 finally reach the transfer position shown in FIG. 4 once more.

Embodiments are also contemplated with additional conveyors (shown schematically at $C_1$ in FIG. 1) and corresponding additional cam guide surface transitions (shown schematically at $C_2$ in FIG. 6), provided at a single carrier.

In practical embodiments of the invention, with two tool sets on a single carrier, one is able to process up to 4400 components in an hour.

While I have shown and described only several embodiments in accordance with the present invention, it is understood that the same is not limited thereto but is susceptible of numerous changes and modifications as would be known to those skilled in the art and I therefore do not wish to be limited to the details shown and described herein but intend to cover all such changes and modifications as are encompassed by the scope of the appended claims.

I claim:

1. Apparatus for automatically preparing leads of electrical components such as transistors and the like of the type having leads protruding from one side of the body of the component; said apparatus comprising:
    a tool carrier rotatable about a tool carrier axis;
    first and second bending and crimping tools disposed pairwise at the periphery of the carrier for movement therewith, said first tool being mounted at the carrier for pivotal movement about a tool pivot axis extending parallel to the tool carrier axis;
    cam means operable in dependence on the rotational position of the carrier to control the movement of said first tool about the tool pivot axis between a tool open position with said first and second tools apart from one another and a tool closed position with said first and second tools adjacent one another to bend and crimp component leads disposed therebetween,
    a transfer slot disposed adjacent the carrier along the travel path of the first and second tools;
    and conveyor means for conveying electrical components with unprepared leads to said transfer slot,
    said tools and cam means being configured and disposed to maintain said tools in an open position as they pass adjacent said transfer slot with one of said tools gripping an unprepared component disposed in said transfer slot, followed by closing of said tools to bend and crimp the leads of said component while carrying the component along with the carrier.

2. Apparatus according to claim 1, further comprising a cutting tool for automatically trimming the leads while they are gripped by said tools.

3. Apparatus according to claim 2, further comprising a supply container for storing components, said conveyor means extending between said supply container and said transfer slot.

4. Apparatus according to claim 2, wherein the first tool is subject to the action of a spring that forces it into the open position.

5. Apparatus according to claim 1, wherein the carrier is a disc.

6. Apparatus according to claim 1, wherein the first tool is subject to the action of a spring that forces it into the open position.

7. Apparatus according to claim 1, wherein the cam means includes a first circular section with a large diameter and a second circular section with a small diameter with steep transitions between said first and second sections, whereby the second section with the small diameter extends at least into the area of the transition point of conveyor, said transfer slot being located at said transition point.

8. Apparatus according to claim 7, wherein a plurality of conveyors is arranged relative to the carrier, and wherein the cam means is provided with a corresponding number of first and second circular sections with corresponding transitions.

9. Apparatus according to claim 1, wherein two or more of said pairs of tools are mounted on the periphery of the carrier, and wherein a conveyor is associated with each pair of tools, whereby the cam means is provided with a corresponding number of curved sections with steep transitions for controlling all of said pairs of tools.

10. Apparatus according to claim 1, wherein a holder and bracket for gripping leads of components directly beneath the component body are disposed above the respective tools, both of which holder and bracket have their movement limited with respect to the tool with which they are associated under the action of a spring and a stop in such manner that during the closing movement of the swivelable first tool the holder associated therewith is entrained until it comes to rest against the bracket, then, as the actual working movement begins, the bracket is entrained against the spring supporting it, and finally when the holder and bracket come to rest, the swivelable tool is moved against the spring resting against the holder until it reaches its final position.

11. Apparatus according to claim 10, wherein the spring which abuts the holder against the swivelable first tool has larger spring tension than the spring which rests against the bracket.

12. Apparatus according to claim 10, wherein one of said holder and bracket is provided with a recess which accepts the leads and the other of said holder and bracket is provided with a nose which fits into the recess.

13. Apparatus according to claim 1, wherein each of the tools is adjustably mounted on support arms, and wherein support arms are in turn directly mounted on the carrier.

14. Apparatus according to claim 1, wherein said carrier is interchangeably and detachably attached to a drive coupling therefor, whereby carriers with other tools can be readily exchanged.

15. Apparatus according to claim 13, wherein the support arm of the swivelable first tool is connected with the support arm of the second fixed tool via a swivel bearing, and wherein the fixed second tool is interchangeably mounted on the carrier.

16. Apparatus according to claim 1, wherein an ejector is associated with the fixed second tool and travels therewith, said ejector being actuated by a fixed stop disposed in the path of revolution of this second tool.

17. Apparatus according to claim 16, wherein the ejector consists of a swivel lever mounted on one of the second tool and a support arm of the second tool, said swivel lever having a first ejector nose part mounted at the level of the component body and a second ejector nose part at the level of the component leads, said swivel lever being swivelable by a fixed stop from a resting position which does not interfere with the tools into a position in which the component is released from the second tool, and wherein a spring is provided which pushes said swivel arm toward its rest position.

18. Apparatus according to claim 2, wherein the cutting tool is fixedly mounted in the path of movement of the tools and is provided with a rotatably mounted round knife.

19. Apparatus according to claim 1, wherein the conveyor means is provided with a groove inclined relative to the carrier, the bottom of said groove being provided with a conveyor slot through which the leads of components project, said conveyor slot making a transition at its end to the transfer slot.

20. Apparatus according to claim 16, wherein ahead of the point at which the conveyor slot makes the transition to the transfer slot, a separating slide is disposed, said separating slide being located between the body of the component which is held in the transfer slot and the body of the next following component, said separating slide being movable in response to movement of the carrier into the separating position as a pair of tools passes the transfer slot.

21. Apparatus according to claim 17, wherein the wall of the transfer slot facing the carrier is made in the form of a holder which is mounted in a tensioned manner against the body of the component in the transfer slot, said holder being swiveled out of a position in which it lightly grips the body of the component between itself and separating slide as this component is gripped by the passing tool, into the open position, and then back again.

22. Apparatus according to claim 20, wherein a control element for the separating slide is mounted on the carrier in the vicinity of the tools.

23. Apparatus according to claim 22, wherein the control element is made in a flexibly tensioned manner.

24. Apparatus according to claim 19, wherein the groove of the conveyor and the transfer slot are mounted height-adjustably relative to the tools.

25. Apparatus according to claim 3, wherein the supply container is a vibrating pot, to whose upper edge the conveyor means is fastened.

26. Apparatus according to claim 25, wherein said vibrating pot includes:
 a feed section ramp extending upwardly from the bottom of the pot for feeding components therealong in response to vibration of said pot, said feed section ramp terminating in an upper edge over which said components fall,
 and an alignment section ramp extending upwardly from a position below the upper edge of said feed section ramp for upwardly feeding components supplied thereto over said upper edge of said feed section ramp in response to vibration of said pot, said alignment section ramp including a holding edge engageable with bodies of said components to automatically align said components with their leads extending radially of said pot during movement of said components along said alignment section ramp.

27. Apparatus according to claim 26, wherein said vibrating pot is of substantially cylindrical construction, wherein said ramps extend along inwardly facing walls of said vibrating pot, and wherein said holding edge is spaced from said wall by a distance greater than the length of said component bodies.

28. Apparatus according to claim 26, wherein said alignment section ramp is inclined radially downwardly toward the center of the pot and is configured so that the leads of the components are moved to face radially inward as the components are moved along said alignment section ramp in response to said vibration of the pot.

29. Apparatus according to claim 27, wherein said alignment section ramp is inclined radially downwardly toward the center of the pot and is configured so that the leads of the components are moved to face radially inward as the components are moved along said alignment section ramp in response to said vibration of the pot.

30. Apparatus according to claim 29, wherein said alignment section ramp is inclined more steeply to the vertical at its upper end than at its lower end.

31. Apparatus for automatically preparing leads of electrical components such as transistors and the like of the type having unprepared leads asymmetrically disposed with respect to the body of the component; said apparatus comprising:
 a tool carrier rotatable about a tool carrier axis;
 first and second bending and crimping tools disposed pairwise on the carrier for movement therewith;
 tool control means movable with said carrier and being operable in dependence on the rotative position of the carrier to control the movement of said tools between a tool open position with said tools spaced from one another and a tool closed position with said tools adjacent one another to bend and crimp component leads disposed therebetween;
 and conveyor means for conveying components sequentially to a predetermined ready position adjacent said carrier;
 said tools and tool control means including means to maintain said tools in a tool open position as they pass adjacent said ready position with one of said tools disposed to grip a component in said ready position, followed by movement of said tools to said tool closed position to bend and crimp the leads of said component while simultaneously carrying the component along with the rotating carrier, whereby continuous automatic preparation of said component leads is accommodated with a continuously rotating carrier.

32. Apparatus according to claim 31, wherein said control means includes cam means.

33. Apparatus according to claim 32, wherein one of said tools is pivotally mounted at said carrier to pivot about a pivot axis extending parallel to said tool carrier axis, and wherein said cam means engages a cam follower of said pivotally mounted tool to control the movement thereof.

34. Apparatus according to claim 31, further comprising lead holding means carried by said tools and movable with respect to said tools, said lead holding means being engageable with said leads at a position intermediate the component body and the portions of the leads being crimped and bent, whereby disturbance of the connection of the component body and leads is minimized during bending and crimping operations.

35. Apparatus according to claim 31, further comprising a cutting tool for automatically trimming the leads while they are gripped by said tools.

36. Apparatus according to claim 31, further comprising ejector means for ejecting components from said tools in response to the rotative position of said carrier.

37. Vibrating pot apparatus for automatically transferring and aligning electrical components such as transistors and the like of the type having leads protruding from one side to the body of the component; said apparatus comprising:
a vibrating pot enclosing a space for accommodating a supply of electrical components,
a feed section ramp extending upwardly from the bottom of the pot for feeding components therealong in response to vibration of said pot, said feed section ramp terminating in an upper edge over which said components fall,
and an alignment section ramp extending upwardly from a position below the upper edge of said feed section ramp for upwardly feeding components supplied thereto over said upper edge of said feed section ramp in response to vibration of said pot, said alignment section ramp including a holding edge engageable with bodies of said components to automatically align said components along said alignment section ramp, those portions of said alignment section ramp radially inwardly of said holding edge being downwardly inclined toward the center of the vibration pot to permit return of components to the feed section ramp, which components are improperly oriented to be aligned at said holding edge.

38. Apparatus according to claim 37, wherein said vibrating pot is of substantially cylindrical construction, wherein said ramps extend along inwardly facing walls of said vibrating pot, and wherein said holding edge is spaced from said wall by a distance greater than the length of said component bodies.

39. Apparatus according to claim 38, wherein said alignment section ramp which is inclined radially downwardly toward the center of the pot is configured so that the leads of the components are moved to face radially inward as the components are moved along said alignment section ramp in response to said vibration of the pot.

40. Apparatus according to claim 39, wherein said alignment section ramp is inclined more steeply to the vertical at its upper end than at its lower end.

41. Apparatus for automatically preparing leads of electrical components such as transistors and the like of the type having leads protruding from one side of the body of the component; said apparatus comprising:
a tool carrier;
first and second bending and crimping tools disposed pairwise at the carrier, said first tool being mounted at the carrier for pivotal movement about a tool pivot axis;
control means for controlling the movement of said first tool about the tool pivot axis between a tool open position with said first and second tools apart from one another and a tool closed position with said first and second tools adjacent one another to bend and crimp component leads disposed therebetween,
and a holder and bracket disposed above the respective tools for gripping leads of components directly beneath the component body, said holder being connected to said first tool by a first lost-motion stop connection and a first spring means and said bracket being connected to said second tool by a second lost-motion stop connection and a second spring means so that, during the closing movement of the swivelable first tool and the holder associated therewith is entrained until it comes to rest against the bracket, then, as the actual working movement begins, the bracket is entrained against the second spring means supporting it, and finally when the holder and bracket come to rest, the swivelable tool is moved against the first spring means resting against the holder until it reaches its final position.

42. Apparatus according to claim 41, wherein the second spring means which abuts the holder against the swivelable first tool has larger spring tension than the first spring means which rests against the bracket.

43. Apparatus according to claim 41, wherein one of said holder and bracket is provided with a recess which accepts the leads and the other of said holder and bracket is provided with a nose which fits into the recess.

* * * * *